United States Patent [19]

Blanchard

[11] 4,393,391
[45] Jul. 12, 1983

[54] POWER MOS TRANSISTOR WITH A PLURALITY OF LONGITUDINAL GROOVES TO INCREASE CHANNEL CONDUCTING AREA

[75] Inventor: Richard A. Blanchard, Los Altos Hills, Calif.

[73] Assignee: Supertex, Inc., Sunnyvale, Calif.

[21] Appl. No.: 159,778

[22] Filed: Jun. 16, 1980

[51] Int. Cl.³ .............................................. H01L 29/78
[52] U.S. Cl. ........................................ 357/23; 357/55
[58] Field of Search ..................... 357/23, 53, 55, 56

[56] References Cited

U.S. PATENT DOCUMENTS

| Re. 29,971 | 4/1979 | Nishizawa et al. | 357/23 |
| 2,980,809 | 4/1961 | Teszner | 357/23 |
| 3,766,448 | 10/1973 | Luce et al. | 357/53 |
| 3,851,379 | 12/1974 | Gutknecht et al. | 357/23 |
| 3,953,879 | 4/1976 | O'Arlach et al. | 357/56 |
| 4,005,467 | 1/1977 | Vergnolle | 357/55 |
| 4,065,742 | 12/1977 | Kendall et al. | 357/56 |
| 4,065,782 | 12/1977 | Gray et al. | 357/55 |
| 4,234,887 | 11/1980 | Vanderslice | 357/55 |
| 4,254,430 | 3/1981 | Beneking | 357/56 |

OTHER PUBLICATIONS

L Heller, "Double Density VMOS CCD," IBM Tech. Discl. Bull., vol. 22 #11, Apr. 1980, pp. 4859–4860.

Primary Examiner—Joseph E. Clawson, Jr.
Attorney, Agent, or Firm—Harry M. Weiss

[57] ABSTRACT

A semiconductor device providing improved utilization of semiconductor surface area by enhancing the current carrying capability per unit area. The improvement arises from contouring the surface in the conductive channel region of the device so that the current carrying channel is wider than the plane surface that it occupies. This morphology may be achieved by forming troughs having optional rectangular, "U", or "V" shapes; the troughs run parallel to the conductive channel current flow. The improvement is especially useful for MOS and power MOS transistors, and is applicable to DMOS transistors as well as conventional MOS transistors.

5 Claims, 6 Drawing Figures

POWER MOS TRANSISTOR WITH A PLURALITY OF LONGITUDINAL GROOVES TO INCREASE CHANNEL CONDUCTING AREA

BACKGROUND OF THE INVENTION

1. Field of the Invention

This invention relates to majority carrier semiconductor devices and especially relates to MOS transistors.

2. Description of the Prior Art

MOS transistors have traditionally had major application in complex circuits where large current-carrying capability is not a substantial requirement. While power MOS devices have long been contemplated, they were precluded for many years by the inability to achieve a sufficiently high yield to enable fabrication of the large devices required. Due to the yield improvements achieved in complex low-power MOS circuits, MOS power transistors are now viable.

The conventional MOS transistor of the prior art comprises a planar channel region in a confined region at the surface of the semiconductor substrate. An insulated electrode controls the channel conductivity; carriers are introduced into and extracted from the channel by semiconductor regions opposite in conductivity type to the semiconductor substrate at opposite extremities of the channel; current is said to flow from the source to the drain. The channel conductance between the source and drain may be made larger by decreasing the source drain spacing; this decrease is limited by the desired voltage breakdown of the device and/or by the practical effect of uncontrollable spacing variations leading to source-drain shorts as the spacing becomes very small.

The channel conductance or current carrying capability may also be enhanced by increasing the width of the channel in a direction transverse to source-drain current flow. For fixed source-drain spacing, the current-carrying capability is just proportional to the width, and hence the area of the channel. Since the source and drain regions also require substantial area to permit external connection thereto and/or allow current flow therein without engendering unacceptable ohmic drops, the current-carrying ability increases substantially proportionately with area of the whole device for a fixed source-drain spacing.

The cost associated with producing the semiconductor element itself is roughly proportional to the area in any given technology. If some of the devices are nonworkable because of random defects having a density d per unit area, then the cost of a good device is proportional to A/(1-dA.) Since the current-carrying capability is proportional to A, the cost goes up faster than the current-carrying capability. Reduced unit costs obtain if the area A for achieving the same function can be reduced utilizing substantially the same technology.

SUMMARY OF THE INVENTION

It is an object of the present invention to increase the current-carrying capability of majority-carrier semiconductor devices.

It is a further object of the present invention to increase the current-carrying capability of semiconductor devices such as MOS transistors without increasing their area.

It is yet a further object of the present invention to increase the current-carrying capability of MOS transistors with a given source-drain spacing without increasing their area.

It is yet a further object of the present invention to provide the foregoing objectives for MOS transistors having substantially a conventional format, as well as for devices in alternative formats.

It is yet another object of the present invention to achieve the foregoing objectives without substantially modifying the process sequence (technology) of a semiconductor device of a given format.

It is a further object of the present invention to provide improved MOS power transistors.

To achieve the foregoing objectives, the present invention contemplates increasing the effective width of the conductive channel of a semiconductor device such as an MOS transistor without substantially increasing its area. The preferred embodiments achieve this result by the inclusion of grooves of alternative shapes in the surface of the channel region; the grooves lie parallel to the majority-carrier current path between the source and the drain of the device. In an MOS device, grooves are formed prior to the provision of the gate and gate insulator over the channel region. In this way, there is minimal perturbation of the particular proven process sequence for forming the device.

The achievement of the foregoing objectives is illustrated by drawings and descriptions of several preferred embodiments of the instant invention.

DETAILED DESCRIPTION

Figure 1:
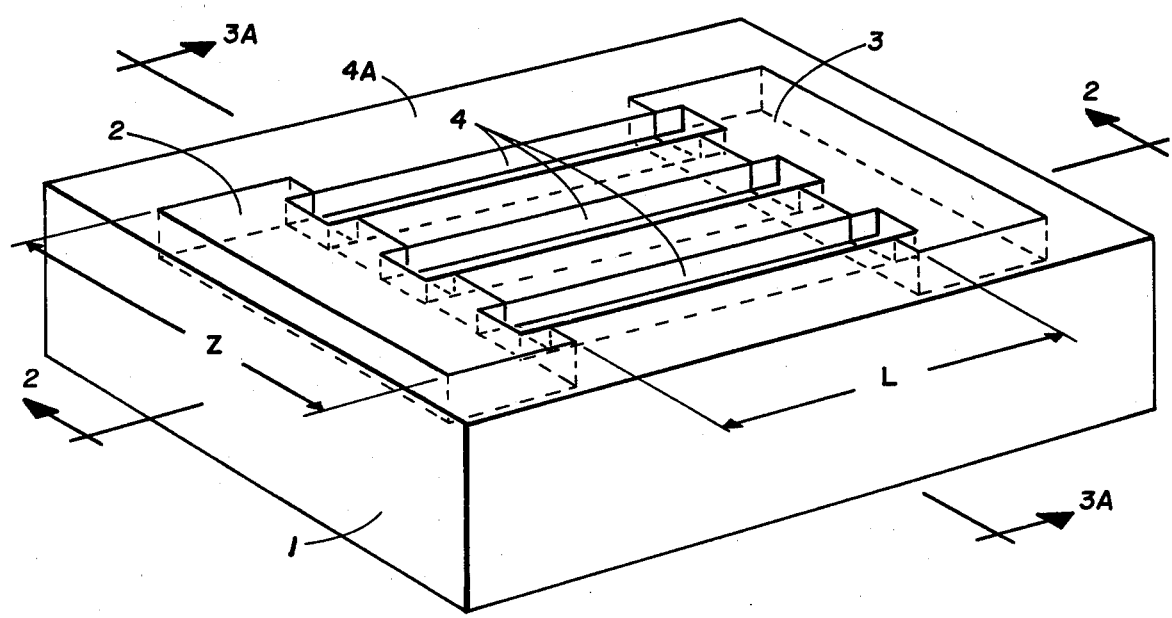
FIG. 1 is a plan view of relevant portions of an MOS device embodying the present invention.

Referring to FIG. 1, the essential elements of an MOS device according to the present device. The traditional format of an MOS device comprises a substrate 1 of a first conductivity-type and having an upper or major surface including source region 2 and drain region 3 of a second conductivity-type opposite first conductivity-type separated at the surface by a region of first conductivity-type comprising substrate 1. A thin insulator (not shown) and conductive gate means over by the substrate 1 between source region 2 and drain region 3, whereby a conductive channel of second-conductivity type is controlled in the surface of the substrate 1 by means of the insulated conductive gate means. Hence current flow between regions 2 and 3 is controllable.

To maximize the current flow in the conductive channel, its length L is minimized and the width Z is maximized. As explained hereinbefore, certain practical and theoretical considerations place limits on these extremes.

Figure 2A:
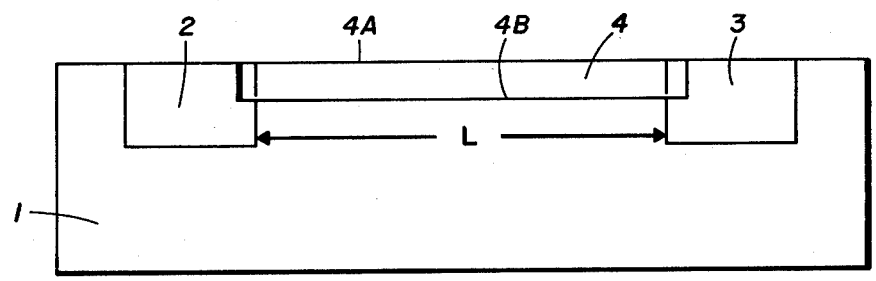
FIGS. 2A and 2B are sectional views of preferred MOS embodiments of the present invention.
Figure 3A:
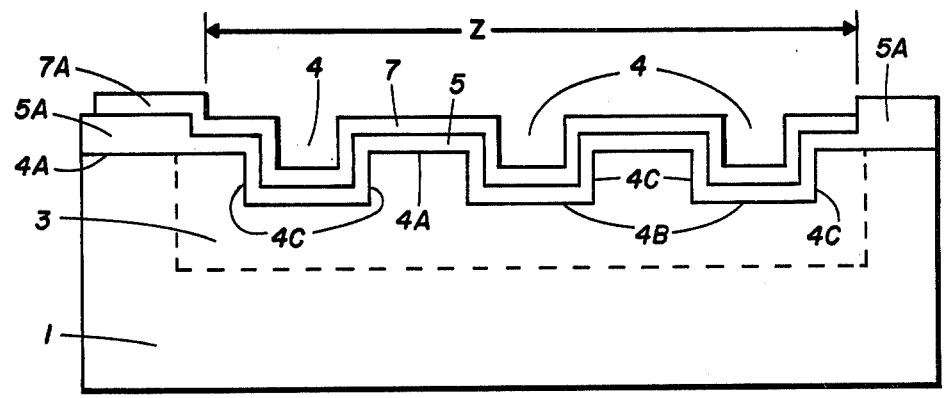
FIGS. 3A, 3B and 3C are sectional views of alternative means for providing the improvements of the present invention in the MOS format.

In the device of FIG. 1 a series of grooves 4 are provided parallel with the upper major surface and running in a direction mutually orthogonal to both source region 2 and drain region 3. These grooves of FIG. 1 have a generally rectangular cross-section in a direction orthogonal to the current flow as may be seen more clearly in FIG. 3A, which is a cross-section of FIG. 1 at any point between source 2 and drain 3. The grooves 4 have a bottom surface portion 4B, side surface portions 4C, and terminate at the substantially plane upper major surface of substrate 1. FIG. 3A also details the thin insulating layer 5 and conductive gate means 7 which cooperate to control a conductive channel of second-conductivity type opposite the conductivity type of the substrate 1; this channel is formed in all of the surface portions 4A, 4B and 4C under the insulator 5 and conductive gate means 7 when a suitable potential is applied to the latter. As shown in FIG. 2A which is a cross-section of Figure above the direction of current flow, the length L of the channel is not changed by the grooves even if they extend into (or perhaps entirely across) source 2 and drain 3.

The surface portions 4A and 4B in FIG. 3A are seen to have a width equal to that of the geometrical channel width Z of the device. However, the effective channel width Z′ (not shown) is greater than Z because of the vertical surface portions 4C which are also conductive. Clearly Z′/Z is maximized by forming as many grooves 4 as practicable across the width of the conducting channel. The conducting channel remains parallel with the upper major surface 4A in the directions mutually orthogonal to source 2 and drain 3; parallelism fails in other surface directions as indicated by the castellated structure of surface portions 4A, 4B and 4C in FIG. 3A. The grooves 4 are thus parallel with the current flow in the conducting channel.

Figure 3B:
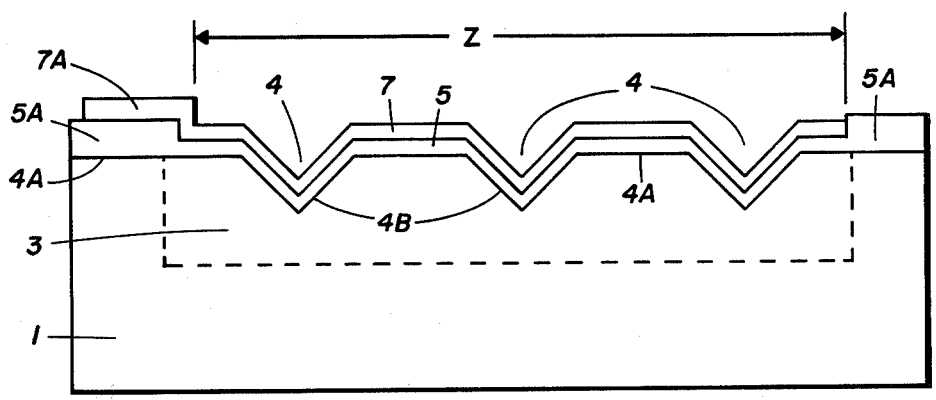
Figure 3C:
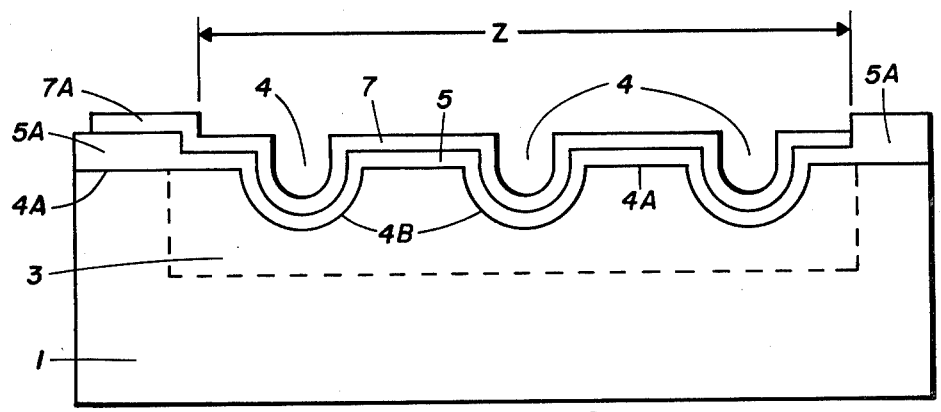

The grooves 4 are preferably formed in the upper major surface prior to the other steps in the fabrication sequence. In this way, there is minimum disturbance of preferred sequence for forming source 2, drain 3, insulating layer 5, and conductive gate means 7. Grooves 4 of rectangular cross section are preferably formed by a combination of masking and preferential etching into a substrate having a predetermined crystallographic orientation. Suitable etches and preferred orientations are well known in the semiconductor art and will not be described further here. Similarly, grooves with a "V"-shaped cross section or a "U"-shaped cross section, as shown in FIGS. 3B and 3C respectively, may be obtained by known etches and crystallograph orientations; the preferred groove configuration will probably be primarily determined by the minimal achievable spacing and concomitant yield.

Figure 2B:
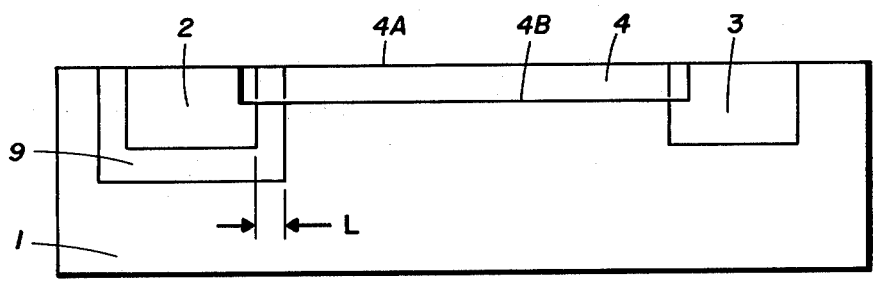

FIG. 2B is a cross section along the direction of current of DMOS device, an alternative to the conventional format of FIG. 2A. Here a conductive channel of length L is formed by doped surface regions 1 and 2 of first conductivity type separated by region 9 of second conductivity-type opposite the first-conductivity-type. If regions 2 and 9 are formed, for example, by sequential diffusions into substrate 1 through a common masking aperture, the channel length L is made very small. Region 2 forms the source, and substrate 1 the drain of the device; drain current may be withdrawn through a drain region of higher conductivity (but the same conductivity type) than substrate 1, or the drain current may be alternatively withdrawn via a contact (not shown) on the lower major surface of substrate 1. The groove 4 includes at least the channel region denoted by L and may additionally extend into (as shown in FIG. 2B) or through each or either of regions 2 and 3.

While the present invention has been illustrated by means of preferred embodiments comprising MOS devices, it will be appreciated by those skilled in the art that the principles and techniques of the present invention are likewise applicable to other semiconductor devices having a conductive means parallel with a major surface. For example, the invention is readily adaptable to a low-value resistor formed in the surface, and to the subsurface conductive channel of a junction field-effect transistor. In the latter case the conductive channel would lie under a semiconductor gate region of opposite conductivity type rather than by the insulated gates described hereinbefore. In an integrated circuit comprising a number of devices where it is often desirable to maximize the conductance of some devices and minimize the conductance of others, such devices could be oriented with conductive current flow parallel and perpendicular to the grooves respectively in order to aid in obtaining the desired device functions.

Yet other applications will manifest themselves to those skilled in the art in light of the description and claims of the present invention.

What is claimed is:

1. A semiconductor device comprising in combination:
    a substrate having a substantially plane first major surface;
    first and second spaced regions of a first conductivity type formed in said surface;
    a third region of a second conductivity type opposite said first conductivity type between said first and said second regions at said surface;
    a plurality of spaced groove regions in said major surface, said groove regions being separated by portions of said substrate coplanar with said first major surface, and said grooves extending into each of said first, second, and third regions;
    a thin insulating layer over said third region both in said grooves and across surface portions coplanar with said first major surface; and
    gate means over said insulating layer for controlling a conductive surface channel between said first and second regions in said grooves and at said first major surface.

2. The device of claim 1, wherein said third region surrounds only one of said first and said second regions at said surface.

3. The device of claim 1, wherein said grooves are substantially "V"-shaped in cross-section.

4. The device of claim 1, wherein said gate means comprises a single electrically conductive member having a plurality of recessed portions extending between said first and second regions.

5. The device of claim 1, wherein said insulator has substantially the same thickness in said groove means and over said surface portion.

* * * * *